US012588169B2

(12) United States Patent
Chehade et al.

(10) Patent No.: US 12,588,169 B2
(45) Date of Patent: Mar. 24, 2026

(54) METHOD FOR CONTROLLING A COOLING SYSTEM FOR AUTONOMOUS COOLING OF A RACK

(71) Applicant: OVH, Roubaix (FR)

(72) Inventors: Ali Chehade, Moncheaux (FR); Hadrien Bauduin, Villeneuve d'Ascq (FR); Michel Bieske, Wasquehal (FR)

(73) Assignee: OVH, Roubaix (FR)

( * ) Notice: Subject to any disclaimer, the term of this patent is extended or adjusted under 35 U.S.C. 154(b) by 831 days.

(21) Appl. No.: 17/896,366

(22) Filed: Aug. 26, 2022

(65) Prior Publication Data

US 2023/0069220 A1     Mar. 2, 2023

(30) Foreign Application Priority Data

Aug. 31, 2021   (EP) ..................................... 21306190

(51) Int. Cl.
*H05K 7/20*          (2006.01)

(52) U.S. Cl.
CPC ..... *H05K 7/20836* (2013.01); *H05K 7/20263* (2013.01); *H05K 7/20736* (2013.01); *H05K 7/20781* (2013.01)

(58) Field of Classification Search
CPC .......... H05K 7/20836; H05K 7/20736; H05K 7/20781
See application file for complete search history.

(56) References Cited

U.S. PATENT DOCUMENTS

| | | | |
|---|---|---|---|
| 8,583,290 B2 | 11/2013 | Campbell et al. | |
| 9,091,496 B2 | 7/2015 | Imwalle et al. | |
| 9,250,636 B2 | 2/2016 | Chainer et al. | |

| | | | |
|---|---|---|---|
| 9,398,731 B1 | 7/2016 | Imwalle et al. | |
| 9,723,763 B2 | 8/2017 | Berghe | |
| 10,146,231 B2 | 12/2018 | Shelnutt et al. | |
| 10,159,167 B2 | 12/2018 | Altizer et al. | |
| 10,180,665 B2 | 1/2019 | Brey et al. | |
| 10,238,011 B1 | 3/2019 | Cui et al. | |
| 10,342,163 B2 | 7/2019 | Wong et al. | |
| 10,653,044 B2 | 5/2020 | Chainer et al. | |
| 2010/0032142 A1 | 2/2010 | Copeland et al. | |

(Continued)

FOREIGN PATENT DOCUMENTS

EP          3829279 A1     6/2021

OTHER PUBLICATIONS

Extended European Search Report with regard to the EP Patent Application No. 21306190.6 completed on Feb. 15, 2022.

*Primary Examiner* — Allen R. B. Schult

(74) *Attorney, Agent, or Firm* — BCF LLP

(57)          ABSTRACT

A method for controlling a cooling system of a rack, the rack comprising a heat generating component. The method comprises receiving, by a controller, at least one first temperature indications indicative of temperature variations of at least one heat transfer fluid circulating in at least one respective liquid channel of the cooling system; receiving, by the controller, at least one second temperature indications indicative of a temperature of an air flow of ambient air within the rack, the air flow being generated by at least one fan of the cooling system; and adjusting, based on the at least one first and second temperature indications, a rotational speed of the at least one fan and a rotational speed of at least one pump configured for causing the at least one heat transfer fluid to flow in at least one respective liquid channel.

13 Claims, 9 Drawing Sheets

(56) References Cited

U.S. PATENT DOCUMENTS

| | | | |
|---|---|---|---|
| 2013/0138252 | A1 | 5/2013 | Chainer et al. |
| 2014/0068943 | A1 | 3/2014 | Campbell et al. |
| 2014/0202678 | A1 | 7/2014 | Goth et al. |
| 2018/0376612 | A1 | 12/2018 | Ortenzi et al. |
| 2020/0154610 | A1 | 5/2020 | Wilks et al. |

METHOD FOR CONTROLLING A COOLING SYSTEM FOR AUTONOMOUS COOLING OF A RACK

CROSS-REFERENCE

The present application claims priority to European Patent Convention Application No. 21306190.6, entitled "Method for Controlling a Cooling System for Autonomous Cooling of a Rack," filed on Aug. 31, 2021, the entirety of which is incorporated by reference herein.

FIELD

The present technology relates to cooling techniques for electronic equipment. In particular, a cooling system for autonomous cooling of a rack and a method for controlling said cooling system are disclosed.

BACKGROUND

Electronic equipment, for example servers, memory banks, computer discs, and the like, is conventionally grouped in equipment racks. Large data centers and other large computing facilities may contain thousands of racks supporting thousands or even tens of thousands of servers.

The racks, including equipment mounted in their backplanes, consume large amounts of electric power and generate significant thermal energy. In such racks, cooling requirements are thus often significant.

Cooling systems for racks commonly include fans that are mounted within equipment racks to provide forced ventilation cooling to rack-mounted equipment. This solution displaces some of the heat generated within the racks to the general environment of the data center. Air in the environment surrounding the racks is thus also heated and often requires an additional environmental cooling system.

There is thus a desire to provide a method for controlling a cooling system for a rack without necessitating an additional environmental cooling system.

SUMMARY

Embodiments of the present technology have been developed based on developers' appreciation of shortcomings associated with the prior art.

An aspect of the present technology introduces a method for controlling a cooling system for autonomous cooling of a rack, for example a server rack, hosting at least one heat generating component. The cooling system comprises a liquid cooling system and at least one fan generating an air flow of ambient air within the rack. In one embodiment, the liquid cooling system comprises a closed loop providing liquid cooling for the heat generating component via a first heat transfer fluid flowing within the closed loop. An open loop provides cooling for air expelled from the rack by the at least one fan as ambient air. A second heat transfer fluid, for example water, is fed to the open loop via a cold inlet and is brought to a warm temperature by the air expelled by the rack. The warm second heat transfer fluid is then fed to a heat exchanger at a junction between the open loop and the closed loop. The first heat transfer fluid of the closed loop is cooled by thermal transfer from the closed loop to the open loop in the heat exchanger. The second heat transfer fluid from the open loop, which has increased in temperature, is further expelled from the open loop. As the cooling system of the rack provides cooling of air flowing through the rack, requirements for environmental cooling of air surrounding the rack are reduced or eliminated. The rack cooling is thus generally autonomously run by the rack, apart from a cooling fluid source for the open loop.

In one aspect, various implementations of the present technology provide a method for controlling a cooling system of a rack, the rack comprising a heat generating component, the method being executable by a controller, the method comprising receiving, by the controller, at least one first temperature indication indicative of temperature variations of at least one heat transfer fluid circulating in at least one respective liquid channel of the cooling system, receiving, by the controller, at least one second temperature indication indicative of a temperature of an air flow of ambient air within the rack, the air flow being generated by at least one fan of the cooling system, and adjusting, based on the at least one first temperature indication and the at least one second temperature indication, a rotational speed of the at least one fan and a rotational speed of at least one pump configured for causing the at least one heat transfer fluid to flow in at least one respective liquid channel.

In one aspect, various implementations of the present technology provide a method for controlling a cooling system of a rack, the rack comprising a heat generating component, the method being executable by a controller. The method including receiving, by the controller, at least one first temperature indication indicative of temperature variations of at least one heat transfer fluid circulating in at least one respective liquid channel of the cooling system; receiving, by the controller, at least one second temperature indication indicative of a temperature of an air flow of ambient air within the rack, the air flow being generated by at least one fan of the cooling system; adjusting, based on the at least one first temperature indication and the at least one second temperature indication, a rotational speed of the at least one fan and a rotational speed of at least one pump configured for causing the at least one heat transfer fluid to flow in at least one respective liquid channel; receiving, by the controller, an expelled air temperature indication indicative of a temperature of ambient air being expelled from the rack; receiving, by the controller, an incoming fluid temperature indication indicative of a temperature of the at least one heat transfer fluid entering the at least one respective liquid channel; and decreasing, based on the expelled air temperature indication and the incoming fluid temperature indication, the rotational speed of the at least one fan.

In some embodiments of the method, the method further comprises sensing a first temperature of a first heat transfer fluid first entering in at least one liquid cooling unit, the at least one liquid cooling unit being thermally coupled to the at least one heat generating component, decreasing, in response to the first temperature being below a first threshold, the rotational speed of the at least one pump, and increasing the rotational speed of the at least one pump otherwise.

In some embodiments of the method, the liquid cooling system comprises a closed loop comprising at least one liquid cooling unit thermally coupled to the at least one heat generating component, the at least one liquid cooling unit comprising a liquid channel configured for transferring thermal energy from the heat-generating unit to a first heat transfer fluid flowing in the liquid channel, a first primary side of a first liquid-to-liquid heat exchanger, the first primary side being fluidly connected to the liquid channel of the at least one liquid cooling unit, and at least one pump fluidly connected between the first primary side of the first liquid-to-liquid heat exchanger and the at least one liquid cooling unit, the at least one pump being configured for causing the first heat transfer fluid to flow within the closed loop; the liquid cooling system further comprising an open loop comprising an air-to-liquid heat exchanger mounted to the rack so that heated air expelled from the rack by the at least one fan flows through the air-to-liquid heat exchanger before being rejected as ambient air, the air-to-liquid heat exchanger being configured for receive a second heat transfer fluid from a first cold supply line, and a first secondary side of the first liquid-to-liquid heat exchanger, the first secondary side being thermally coupled to the first primary side for transfer of thermal energy from the primary side to the first secondary side when a temperature of the primary side is higher than a temperature of the first secondary side, the first secondary side being fluidly connected to the air-to-liquid heat exchanger, the first secondary side being configured for returning the second heat transfer fluid to a hot return line; the method further comprising determining a first temperature difference between a second temperature of the second heat transfer fluid received from the first cold supply line and a third temperature of the second heat transfer fluid returning to the hot return line; and adjusting the rotational speeds of the at least one fan and the at least one pump comprises increasing the rotational speed of the at least one fan in response to the first temperature difference being above the first threshold.

In some embodiments of the method, the at least one second temperature indication comprises information indicative of a fourth temperature of the air flow within the rack and adjusting the rotational speeds of the at least one fan and the at least one pump comprises increasing the rotational speed of the at least one fan in response to the first temperature difference being above the first threshold and the fourth temperature being above a second threshold.

In some embodiments of the method, in response to the first temperature difference being above the first threshold and the fourth temperature being below a third threshold, the third threshold being below the second threshold, adjusting the rotational speeds of the at least one fan and the at least one pump comprises decreasing the rotational speed of the at least one fan.

In some embodiments of the method, the first temperature indication comprises information indicative of a second temperature difference between a fifth temperature of the second heat transfer fluid entering the first secondary side of the first liquid-to-liquid heat exchanger and the first temperature, and in response to the first temperature difference being below the first threshold, to the fourth temperature being between the second threshold and the third threshold, to the second temperature difference being outside a range defined between a fourth threshold and a fifth threshold, and to the second temperature difference being below the fifth threshold, adjusting the rotational speeds of the at least one fan and the at least one pump comprises decreasing the rotational speed of the at least one fan.

In some embodiments of the method, in response to the first temperature difference being below the first threshold, to the fourth temperature being between the second threshold and the third threshold, to the second temperature difference being above the fifth threshold, and to a third temperature difference between the second temperature and a sixth temperature of the air in a vicinity of the rack being above a sixth threshold, adjusting the rotational speeds of the at least one fan and the at least one pump comprises decreasing the rotational speed of the at least one fan.

In some embodiments of the method, adjusting the rotational speeds of the at least one fan and the at least one pump based on the temperature indication is performed incrementally.

In some embodiments of the method, adjusting the rotational speeds of the at least one fan and the at least one pump based on the temperature indications is performed at a predetermined time interval.

In another aspect, various implementations of the present technology provide a cooling system for autonomous cooling of a rack, the rack comprising at least one heat generating component, the cooling system comprising at least one fan mounted onto the rack and configured for generating an air flow of ambient air within the rack, the air flow receiving at least a portion of a thermal energy generated by the at least one heat generating component in the rack; a closed loop comprising at least one liquid cooling unit thermally coupled to the at least one heat generating component, the at least one liquid cooling unit comprising a liquid channel configured for transferring thermal energy from the heat-generating unit to a first heat transfer fluid flowing in the liquid channel, a first primary side of a first liquid-to-liquid heat exchanger, the first primary side being fluidly connected to the liquid channel of the at least one liquid cooling unit, and at least one pump fluidly connected between the first primary side of the first liquid-to-liquid heat exchanger and the at least one liquid cooling unit, the at least one pump being configured causing the first heat transfer fluid to flow within the closed loop; the cooling system further comprising an open loop comprising an air-to-liquid heat exchanger mounted to the rack so that heated air expelled from the rack by the at least one fan flows through the air-to-liquid heat exchanger before being rejected as ambient air, the air-to-liquid heat exchanger being configured for receive a second heat transfer fluid from a first cold supply line, and a first secondary side of the first liquid-to-liquid heat exchanger, the first secondary side being thermally coupled to the first primary side for transfer of thermal energy from the primary side to the first secondary side when a temperature of the primary side is higher than a temperature of the first secondary side, the first secondary side being fluidly connected to the air-to-liquid heat exchanger, the first secondary side being configured for returning the second heat transfer fluid to a hot return line; and a controller operatively connected to the at least one fan and the at least one pump, the controller being communicatively connected to at least one sensor configured to measure temperature indications.

In some embodiments of the present technology, the temperature indications are indicative of thermodynamic parameters of at least one of the first heat transfer fluid, the second heat transfer fluid, the ambient air and the air flow within the rack.

In some embodiments of the present technology, the at least one sensor is a plurality of sensors comprising a first temperature sensor of the second heat transfer fluid received from the first cold supply line, a second temperature sensor of the second heat transfer fluid returning to the hot return line, a third temperature sensor of the second heat transfer fluid entering the first secondary side of the first liquid-to-liquid heat exchanger, a fourth temperature sensor of the first heat transfer fluid entering the at least one liquid cooling unit a fifth temperature sensor of the ambient air in a vicinity of the rack, and a sixth temperature sensor of the air flow within the rack.

In some embodiments of the present technology, the controller comprises a processor and a memory configured to store instructions, upon being executed by the processor, the instructions causing the controller to adjust, based on the temperature indications, at least one of a rotational speed of the at least one fan, and a rotational speed of the at least one pump.

In some embodiments of the present technology, execution of the instructions by the processor causes the controller to, in response to a first temperature difference between a first temperature sensed by the first temperature sensor and a second temperature sensed by the second temperature sensor being above a first threshold, increase the rotational speed of the at least one fan.

In some embodiments of the present technology, execution of the instructions by the processor further causes the controller to, in response to the first temperature difference being below the first threshold and a third temperature sensed by the sixth temperature sensor being above a second threshold, increase the rotational speed of the at least one fan.

In some embodiments of the present technology, execution of the instructions by the processor further causes the controller to, in response to the first temperature difference being below the first threshold and the third temperature being below a third threshold, decrease the rotational speed of the at least one fan.

In some embodiments of the present technology, execution of the instructions by the processor further causes the controller to, in response to the first difference being below the first threshold, the third temperature being between the second threshold and the third threshold, and a second temperature difference between a fourth temperature sensed by the third temperature sensor and the first temperature being below a fourth threshold, decrease the rotational speed of the at least one fan.

In some embodiments of the present technology, execution of the instructions by the processor further causes the controller to, in response to the first temperature difference being above the first threshold, to the third temperature being between the second threshold and the third threshold, to the second temperature difference being above a fifth threshold, and to a third temperature difference between the first temperature and a fifth temperature sensed by the fifth temperature sensor being above a sixth threshold, decrease the rotational speed of the at least one fan.

In some embodiments of the present technology, adjusting the rotational speeds of the at least one fan and the at least one pump based on the temperature indications is performed incrementally.

In some embodiments of the present technology, adjusting the rotational speeds of the at least one fan and the at least one pump based on the temperature indications is performed at a predetermined time interval.

In some embodiments of the present technology, the air-to-liquid heat exchanger is mounted behind a backplane of the rack.

In some embodiments of the present technology, the air-to-liquid heat exchanger is pivotally connected on the rack.

In some embodiments of the present technology, the closed loop further comprises a second primary side of a second liquid-to-liquid heat exchanger, the second primary side being fluidly connected, in parallel to the first primary side, to the liquid channel of the at least one liquid cooling unit, the at least one pump being a first pump and a second pump, the first pump being configured for causing the first heat transfer fluid to flow through the first primary side of the first liquid-to-liquid heat exchanger, the second pump being configured for causing the first heat transfer fluid to flow through the second primary side of the second liquid-to-liquid heat exchanger. The open loop further comprises a second secondary side of the second liquid-to-liquid heat exchanger, the second secondary side being thermally coupled to the second primary side for transfer of thermal energy from the second primary side to the second secondary side when a temperature of the second primary side is higher than a temperature of the second secondary side, the second secondary side being fluidly connected, in parallel to the first secondary side, to the air-to-liquid heat exchanger, the second secondary side being configured for returning the second heat transfer fluid to the hot return line.

In the context of the present specification, unless expressly provided otherwise, electronic equipment may refer, but is not limited to, "servers", "electronic devices", "operation systems", "systems", "computer-based systems", "controller units", "monitoring devices", a "control devices" and/or any combination thereof appropriate to the relevant task at hand.

In the context of the present specification, unless expressly provided otherwise, the words "first", "second", "third", etc. have been used as adjectives only for the purpose of allowing for distinction between the nouns that they modify from one another, and not for the purpose of describing any particular relationship between those nouns.

Implementations of the present technology each have at least one of the above-mentioned objects and/or aspects, but do not necessarily have all of them. It should be understood that some aspects of the present technology that have resulted from attempting to attain the above-mentioned object may not satisfy this object and/or may satisfy other objects not specifically recited herein.

Additional and/or alternative features, aspects and advantages of implementations of the present technology will become apparent from the following description, the accompanying drawings and the appended claims.

BRIEF DESCRIPTION OF THE DRAWINGS

For a better understanding of the present technology, as well as other aspects and further features thereof, reference is made to the following description which is to be used in conjunction with the accompanying drawings, where.

Figure 1:
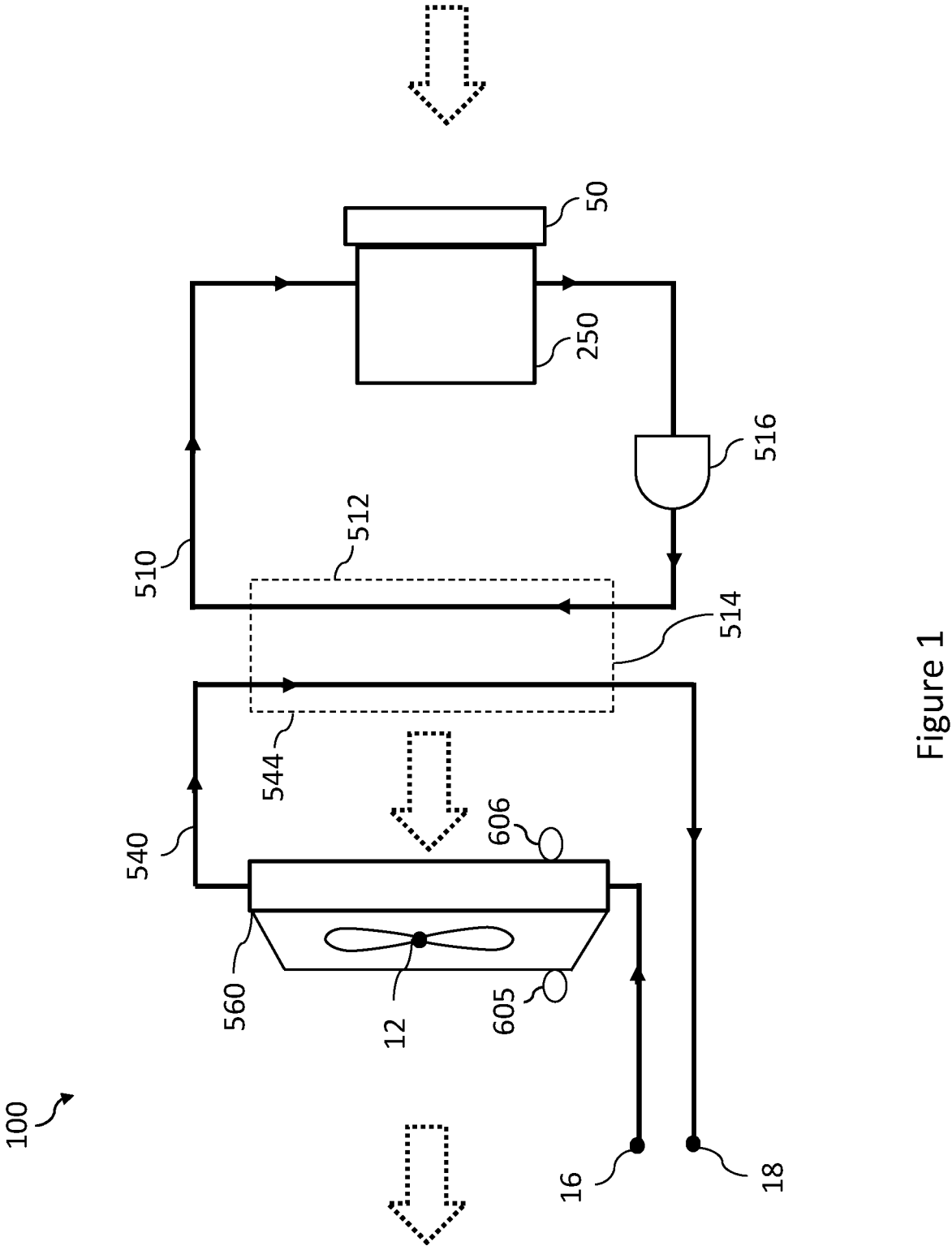
FIG. 1 is a schematic diagram of a cooling system of a server rack in accordance with an embodiment of the present technology.

It should also be noted that, unless otherwise explicitly specified herein, the drawings are not to scale.

DETAILED DESCRIPTION

The examples and conditional language recited herein are principally intended to aid the reader in understanding the principles of the present technology and not to limit its scope to such specifically recited examples and conditions. It will be appreciated that those skilled in the art may devise various systems that, although not explicitly described or shown herein, nonetheless embody the principles of the present technology.

Furthermore, as an aid to understanding, the following description may describe relatively simplified implementations of the present technology. As persons skilled in the art would understand, various implementations of the present technology may be of a greater complexity.

In some cases, what are believed to be helpful examples of modifications to the present technology may also be set forth. This is done merely as an aid to understanding, and, again, not to define the scope or set forth the bounds of the present technology. These modifications are not an exhaustive list, and a person skilled in the art may make other modifications while nonetheless remaining within the scope of the present technology. Further, where no examples of modifications have been set forth, it should not be interpreted that no modifications are possible and/or that what is described is the sole manner of implementing that element of the present technology.

Moreover, all statements herein reciting principles, aspects, and implementations of the present technology, as well as specific examples thereof, are intended to encompass both structural and functional equivalents thereof, whether they are currently known or developed in the future.

With these fundamentals in place, we will now consider some non-limiting examples to illustrate various implementations of aspects of the present technology.

Referring at once to FIGS. 1 to 6, there is described a cooling system 100 for a server rack 10, or simply "rack" 10, the server rack 10 including one or more heat-generating component, the cooling system 100 being suitable for collecting thermal energy generated by the one ore more heat-generating components and, as such, providing cooling capacity to the server rack 10 implementing non-limiting embodiments of the present technology. It is to be expressly understood that the cooling system 100 as depicted is merely an illustrative implementation of the present technology. Thus, the description thereof that follows is intended to be only a description of illustrative examples of the present technology. This description is not intended to define the scope or set forth the bounds of the present technology. In some cases, what are believed to be helpful examples of modifications to the cooling system 100 may also be set forth below. This is done merely as an aid to understanding, and, again, not to define the scope or set forth the bounds of the present technology. These modifications are not an exhaustive list, and, as a person skilled in the art would understand, other modifications are likely possible. Further, where this has not been done (i.e., where no examples of modifications have been set forth), it should not be interpreted that no modifications are possible and/or that what is described is the sole manner of implementing that element of the present technology. As a person skilled in the art would understand, this is likely not the case. In addition, it is to be understood that the cooling system 100 may provide in certain instances simple implementations of the present technology, and that where such is the case they have been presented in this manner as an aid to understanding. As persons skilled in the art would understand, various implementations of the present technology may be of a greater complexity.

As it will be described in greater details hereinafter, the present disclosure describes a method for controlling the cooling system 100 such that power-efficient and autonomous cooling is provided to the rack 10. As such, any system variation configured to be operatively controlled according to methods described herein can be adapted to execute embodiments of the present technology, once teachings presented herein are appreciated. Furthermore, the cooling system 100 will be described using an example of the cooling system 100 illustrated in FIGS. 1 to 6. However, embodiments of the present technology can be equally applied to other types of the cooling system 100.

Figure 4:
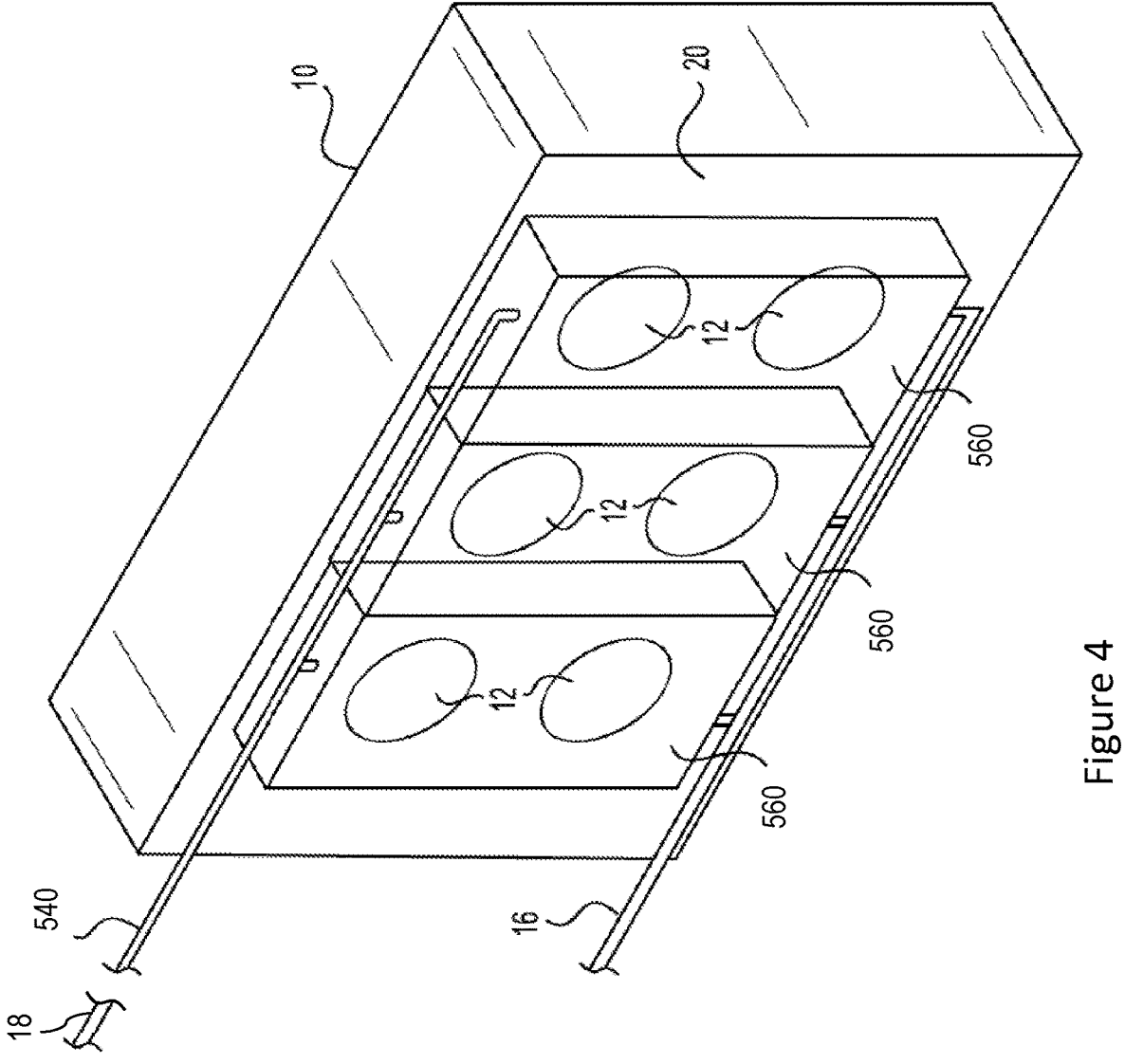
FIG. 4 is a schematic perspective view of the server rack on which three (3) air-to-liquid heat exchangers are mounted.

FIG. 1 is a schematic diagram of the cooling system 100 adapted for providing cooling to the rack 10 (see FIG. 4). The rack 10 may host a plurality of components, for example servers, network switches, power distribution units, processors, graphical processor units, random-access memory devices, hard disk drives, and other electric or electronic devices, that, in use generate thermal energy and are presented as heat-generating components 50 on FIG. 1 (only one of which is depicted for simplicity).

Closed Loop

In this embodiment, the cooling system 100 includes both a closed loop 510 and an open loop 540 and is adapted for providing autonomous cooling of the rack 10. The closed loop 510 and the open loop 540 cooperatively provide sufficient cooling capacity to maintain all components and heat generating components 50 hosted in the rack 10 at a temperature below a safe temperature threshold. In alternative embodiments, the cooling system 100 may comprise a second closed loop (not shown) and/or a second open loop (not shown) to provide redundancy for cooling of the rack 10. Cooling systems including two closed loops and only one open loop, or including one closed loop and two open loops, are also contemplated in applications where redundancy is a less important concern. Moreover, in a datacenter, a plurality of cooling system 100 or portions thereof may independently provide cooling for a plurality of corresponding racks 10.

Water Block

Figure 2:
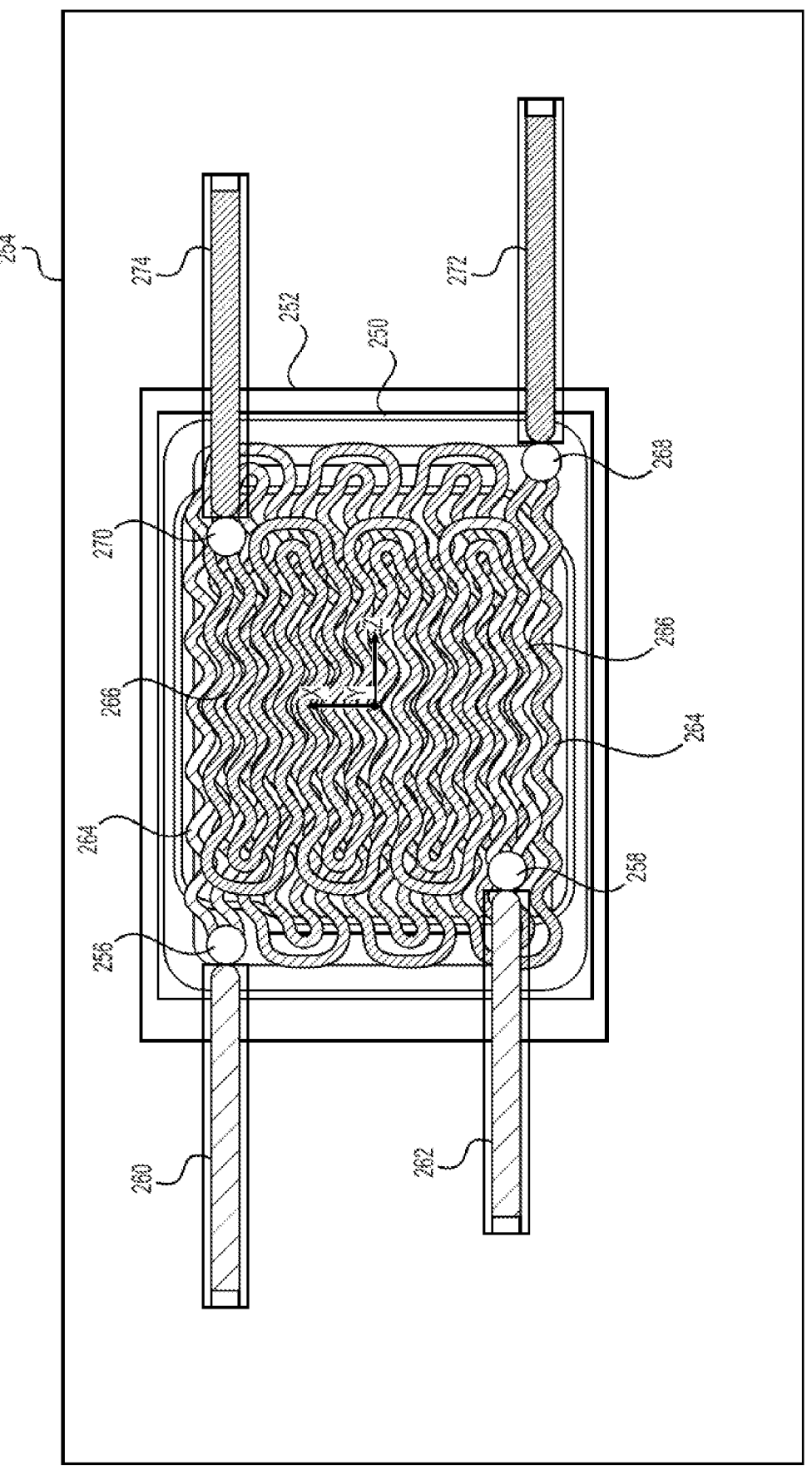
FIG. 2 is a top plan schematic representation of a water block of the cooling system of FIG. 1 in accordance with an embodiment of the present technology.

In this embodiment, the closed loop 510 includes one or more liquid cooling units, illustrated in the present example as a water block 250, thermally coupled to the heat-generating component 50. A non-limiting example of a liquid cooling unit is illustrated in FIG. 2, which is a top plan schematic representation of the water block 250 mounted on a heat generating component 50. The water block 250 is a liquid cooling heat sink, which is thermally coupled to the heat generating component 50 to be cooled, for example on a processor mounted within the server rack 10. A first heat transfer fluid (e.g. water or another liquid) is circulated through a conduit in the water block 250 to absorb the heat from the component. As the first heat transfer fluid flows out of the water block 250, so does the thermal energy absorbed thereby. FIG. 2 is not to scale; while perimeters of the water block 250 and of the heat generating component 50 may be similar, their relative sizes are for illustration purposes only.

The water block 250 may for example include two redundant liquid inlets 256 and 258 respectively connectable to redundant conduits 260 and 262 (only their ends is shown) for receiving the first heat transfer fluid. The first heat transfer fluid may thus flow through redundant liquid channels 264 and 266 that zigzag within the water block 250 to maximize the heat absorption potential of the first heat transfer fluid across a surface of the water block 250. The liquid channels 264 and 266 terminate at two redundant liquid outlets 268 and 270 that are respectively connectable to redundant conduits 272 and 274 (only their ends are shown) for hot first heat transfer fluid output.

Other shapes of the water block 250 and/or shapes of its conduits are contemplated in alternative embodiments. For example, the water block 250 may comprise a single internal conduit defining a spiral shape.

Liquid-to-Liquid Heat Exchanger

Figure 3:
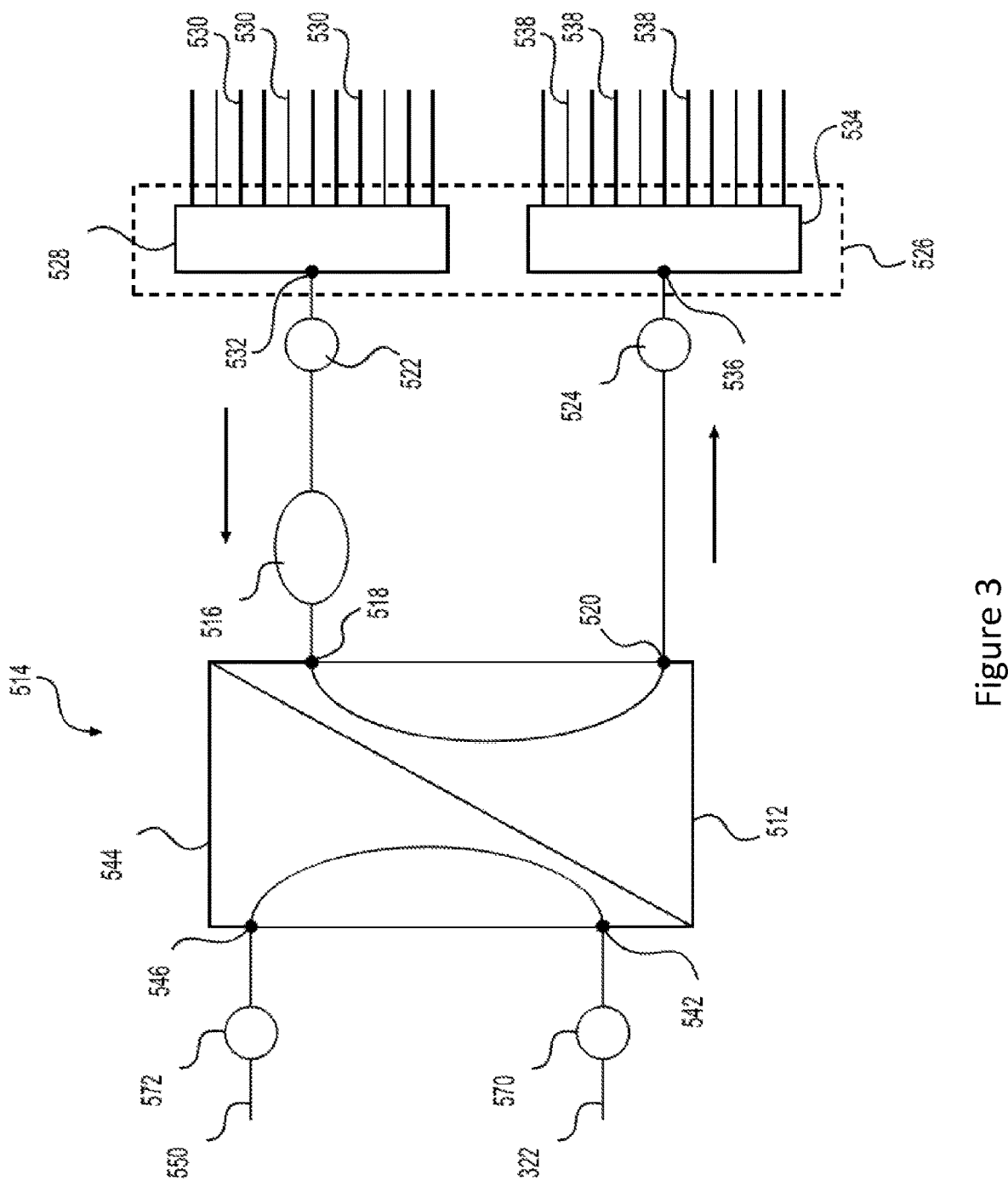
FIG. 3 is a schematic block diagram of a liquid-to-liquid heat exchanger of the cooling system of FIG. 1 in accordance with an embodiment of the present technology.

With additional reference to FIG. 3, the closed loop 510 (FIG. 1) also includes a primary side 512 of a liquid-to-liquid heat exchanger 514. In an embodiment, the liquid-to-liquid heat exchanger 514 is a plate heat exchanger. The primary side 512 is fluidly connected to the liquid channel 264 of the at least one water block 250. A pump 516 is fluidly connected between the at least one water block 250 and the primary side 512 of the liquid-to-liquid heat exchanger 514. The pump 516 maintains a flow of the first heat transfer fluid circulating within the closed loop 510.

The primary side 512 of the liquid-to-liquid heat exchanger 514 comprises a liquid inlet 518 fluidly connected to the liquid outlet 268 of the water block 250, via the pump 516, and a liquid outlet 520 fluidly connected to the liquid inlet 256 of the water block 250. One or more valves may be provided within the connection that extends from the liquid outlet 268 of the water block 250 to the pump 516, and/or within the connection that extends from the liquid outlet 520 of the primary side 512 to the liquid inlet 256 of the water block 250. Said valves may be closed when it is desired to take the closed loop 510 out of service, for example for maintenance purposes. The pump 516 should be turned off when said valves are closed.

As depicted in FIG. 3, in one embodiment, the closed loop 510 includes a manifold 526 including a multi-port inlet 528 having a plurality of ports 530 connectable to the liquid outlets 268 of a plurality of water blocks 250 and one port 532 connectable to a valve 522 for delivering hot first heat transfer fluid from the water blocks 250 to the primary side 512 of the liquid-to-liquid heat exchanger 514 via the pump 516. The manifold 526, in at least some embodiments, also includes a multi-port outlet 534 having a port 536 for receiving, via a valve 524, the first heat transfer fluid having been cooled by the liquid-to-liquid heat exchanger 514. The multi-port outlet 534 also includes a plurality of ports 538 for delivering the first heat transfer fluid to the liquid inlets 256 of the water block 250.

Open Loop

In this embodiment, the open loop 540 comprises a secondary side 544 of the liquid-to-liquid heat exchanger 514 and an air-to-liquid heat exchanger 560. FIG. 4 is a highly schematic perspective view of the rack 10 on which three (3) air-to-liquid heat exchangers are mounted. The server rack 10 hosts a number of servers (not shown) that generate a significant amount of heat. A number of fans 12 (six fans are shown without limiting the present disclosure) expel heated air from the server rack 10 in a direction of three (3) air-to-liquid heat exchangers 560 mounted behind a backplane 20 of the server rack 10. In FIG. 4, the air-to-liquid heat exchangers 560 are shown in transparent form in order to render the fans 12 visible. In this embodiment, the open loop 540 comprises the air-to-liquid heat exchangers 560 that receive cold second heat transfer fluid, for example water, from a cold liquid line 16 and further transmit the heated second heat transfer fluid to the secondary side 544 of the liquid-to-liquid heat exchanger 514 (see FIG. 1). The airflow having passed through the air-to-liquid heat exchangers 560 is cooled to allow maintaining an ambient temperature of the data center to a reasonable level. The second heat transfer fluid is then directed to a hot liquid line 18. The second heat transfer may, for example be direct through a dry cooler to be cooled and further redirected to the cold liquid line 16. Broadly speaking, the second heat transfer fluid (e.g. water or other liquid) flows within the open loop 540 from the cold liquid line 16, through the air-to-liquid heat exchanger 560 to collect thermal energy from ambient air expelled by the fans 12, through secondary side 544 of the liquid-to-liquid heat exchanger 514 to collect thermal energy from the first heat transfer fluid, and towards the hot liquid line 18. The first and second heat transfer fluid may be a same type of fluid such as, without limitation, water, a two-phase fluid or a refrigerant fluid.

Air-to-Liquid Heat Exchanger

Figure 5:
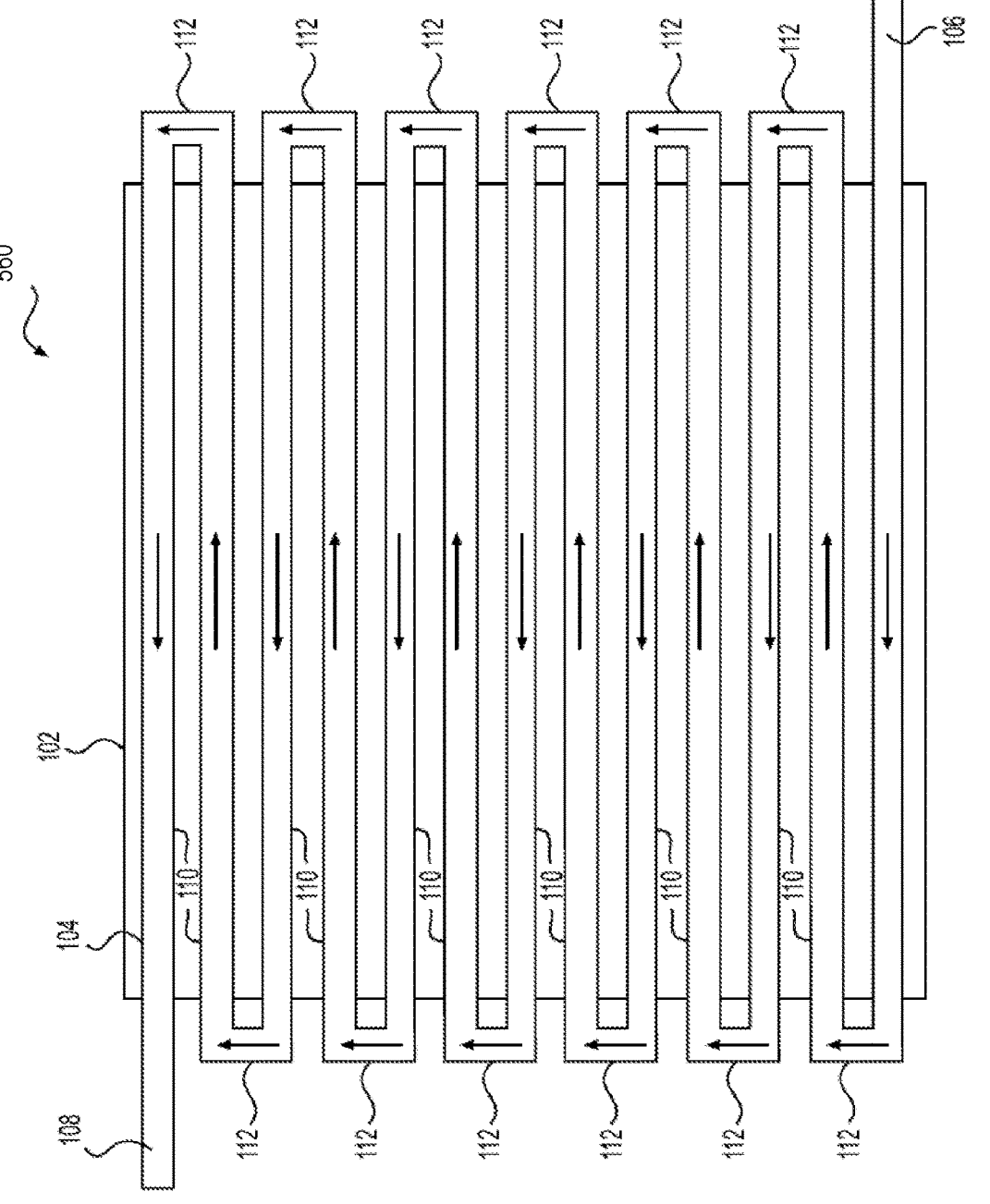
FIG. 5 is a schematic diagram of an air-to-liquid heat exchanger of the cooling system of FIG. 2 in accordance with an embodiment of the present technology.

With reference to FIG. 5, the single-flow air-to-liquid heat exchanger 560 is illustrated schematically. In this embodiment, the single-flow heat exchanger 560 includes a frame 102 and a continuous internal conduit 104. The continuous internal conduit 104 is connected at one end to a liquid inlet 106 and at an opposite end to a liquid outlet 108. In this embodiment, the liquid inlet 106 is connectable to the cold liquid line 16 for receiving the cold second heat transfer fluid. The liquid outlet 108 is connectable to the hot liquid line 18 for returning the second heat transfer fluid that, in operation, has absorbed thermal energy from an airflow passing through the frame 102. The continuous internal conduit 104 forms a plurality of interconnected parallel sections 110 that extend within the frame 102.

In this non-limiting embodiment, the liquid inlet 106 is connected to a first interconnected parallel section 110. Each interconnected parallel section 110, except a last one, is connected to a next interconnected parallel section 110 via a generally U-shaped section 112 of the continuous internal conduit 104. The last interconnected parallel section 110 is connected to the liquid outlet 108. The second heat transfer fluid received at the liquid inlet 106 flows within the continuous internal conduit 104 in the direction shown by the various arrows until it reaches the liquid outlet 108. Thermal energy from the air flowing through the frame 102 of the air-to-liquid heat exchanger 560 is absorbed at least in part by the second heat transfer fluid flowing through the continuous internal conduit 104.

The single-flow heat exchanger 560 is thin, especially when compared to a thickness of the server rack 10. Given its thinness, the single-flow heat exchanger 560 adds little to the overall space occupancy of the server rack 10 in the data center. The thinness of the single-flow heat exchanger 560 further allows its mounting on the server rack 10 by use of hinges (not shown) so that the single-flow heat exchanger 560 is pivotally connected to the rack 10 and may be moved aside, as when opening a door, to provide access to components present in the backplane 20 of the rack 10.

In this non-limiting embodiment, the frame 102 occupies most of the overall width of single-flow heat exchanger 560, as only the generally U-shaped section 112 of the continuous internal conduit 104 protrude on each side of the frame 102. Consequently, the single-flow heat exchanger 560 offers a broad surface that may be traversed by a flow of air expelled from the server rack 10.

Other types of air-to-liquid heat exchangers 560 are contemplated in alternative embodiments. For example, the air-to-liquid heat exchanger 560 may be a multi-flow air-to-liquid heat exchanger. In this example, the liquid inlet 106 may be connected to a first manifold and the liquid outlet 108 is connected to a second manifold. As such, the first manifold may feed the cold second heat transfer fluid to a first plurality of parallel internal conduits similar to the internal conduit 104. As another example, a first group of parallel sections 110 (e.g. each one out of two consecutive parallel sections 110) may be connected in parallel to a common manifold in parallel for receiving the second heat transfer fluid from the liquid inlet 106, and a second group of parallel sections 110 (e.g. each other one out of two consecutive parallel sections 110) may be connected in parallel to a common manifold in parallel for returning the second heat transfer fluid to the liquid outlet 108.

Fans

The fans 12 provide forced air cooling to the heat generating components 50 mounted in the rack 10 and generate an airflow directed toward the corresponding air-to-liquid heat exchanger 560. Each air-to-liquid heat exchanger 560 may be configured for reducing a temperature of the air expelled from the rack 10 to less than a maximum rated air temperature to maintain a safe operating temperature of the corresponding rack 10. Redundancy of the forced air cooling may be obtained by providing at least two fans 12 for each air-to-liquid heat exchanger 560, the at least two fans 12 receiving electrical power from two distinct electrical sources.

Secondary Side of Liquid-to-Liquid Heat Exchanger

As best shown on FIG. 1, the primary side 512 and the secondary side 544 are thermally coupled for transfer of thermal energy from the primary side 512 to the secondary side 544 when a temperature of the primary side 512 is higher than a temperature of the secondary side 544. In operation, the primary side 512 receives the hot first heat transfer fluid from one or more water blocks 250 and its temperature is significantly higher than that of the warm second heat transfer fluid received in the secondary side 544. Therefore, the liquid-to-liquid heat exchanger 514 transfers heat from its primary side 512 to the secondary side 544 (i.e. from the first heat transfer fluid to the second heat transfer fluid). The warm second heat transfer liquid received at the liquid inlet 542 of the secondary side 544 is heated before being expelled from the secondary side 544 via a liquid outlet 546. The heated second heat transfer liquid flows from the liquid outlet 546 and leaves the open loop 540 via the hot return line 18. The open loop 540 could include valves (e.g. valves 570, 572 in FIG. 3) disposed at the liquid outlet 546 and liquid inlet 542 such that it that may be taken out of service by closing said valves.

Figure 6:
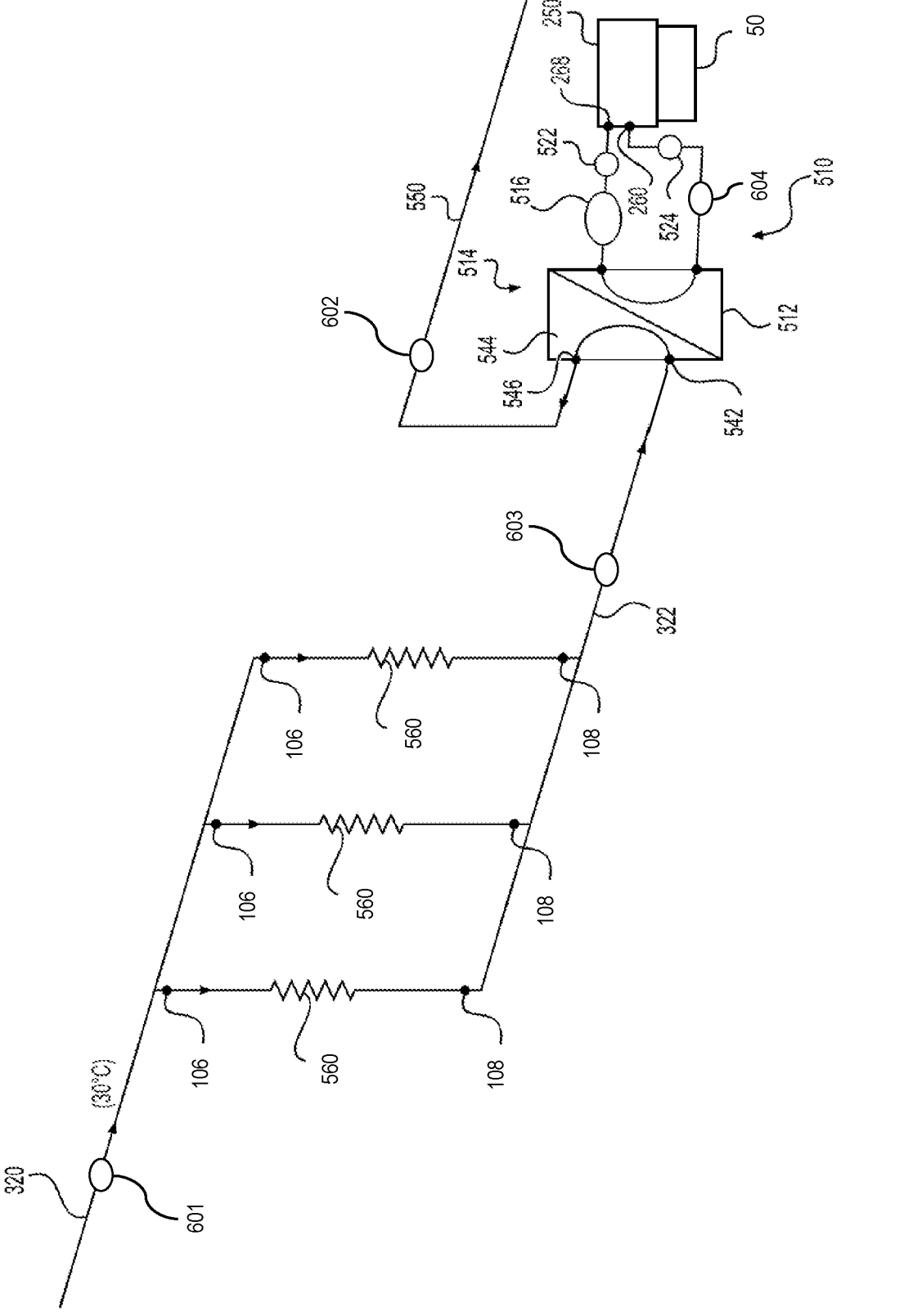
FIG. 6 is a schematic illustration of the cooling system of FIG. 1 having a closed loop including a liquid cooling unit and an open loop including air-to-liquid heat exchangers.

FIG. 6 is a highly schematic illustration of the cooling system 100 in accordance with the presently described non-limiting embodiment of the present technology. As depicted in FIG. 6, the cooling system comprises three (3) air-to-liquid heat exchangers 560 fluidly connected in parallel in the open loop 540. For example, each air-to-liquid heat exchanger 560 may be disposed behind the backplane 20 of the server rack 10, on a respective housing of the server 10 as illustrated on FIG. 1.

In the same or another embodiment, the cooling system 100 includes a plurality of temperature sensors 601, 602, 603, 604, 605 and 606 (see FIGS. 2 and 6), and a controller 930 (see FIG. 9) communicably connected to the plurality of temperature sensors 601, 602, 603, 604, 605 and 606 for controlling the cooling system 100. In another embodiment, the cooling system 100 could also include other sensors such as flow rate sensors of the first and second heat transfer fluids, and/or of the air flowing within the rack 10, that may also be communicably connected to the controller 930. The controller 930 is adapted for receiving temperature indications generated by the sensors and control the cooling system 100 accordingly. Functionalities of the controller 930 may be distributed among a plurality of controllers. In this embodiment, the controller 930 adjusts a rotational speed $\omega_{pump}$ of the pump 516 and/or a rotational speed $\omega_{fan}$ of the fan 12 based on the temperature indications.

In this embodiment, as shown schematically in FIGS. 2 and 6, the cooling system 100 includes:

a first temperature sensor 601 for sensing a temperature $T_{Ri}$ of the second heat transfer fluid received from the cold supply line 16;

a second temperature sensor 602 for sensing a temperature $T_{Ro}$ of the second heat transfer fluid returning to the hot return line 18;

a third temperature sensor 603 for sensing a temperature $T_{AC-O}$ of the second heat transfer fluid entering the secondary side 544 of the liquid-to-liquid heat exchanger 514;

a fourth temperature sensor 604 for sensing a temperature $T_{WC}$ of the first heat transfer fluid entering the water block 250;

a fifth temperature sensor 605 for sensing a temperature $T_{air-C}$ of the ambient air in a vicinity of the rack 10 (e.g. expelled from the rack 10); and a sixth temperature sensor 606 for sensing a temperature $T_{air-H}$ of the air flowing within rack 10.

The temperature indications generated in response to measurements from the first to fourth temperature sensors 601, 602, 603 and 604 are indicative of thermodynamic parameters of the first heat transfer fluid and the second heat transfer fluid. Similarly, the temperature indications generated in response to measurements from the fifth and sixth temperature sensors 605 and 606 are indicative of thermodynamic parameters of the ambient air and the air flow within the rack respectively.

Figure 7:
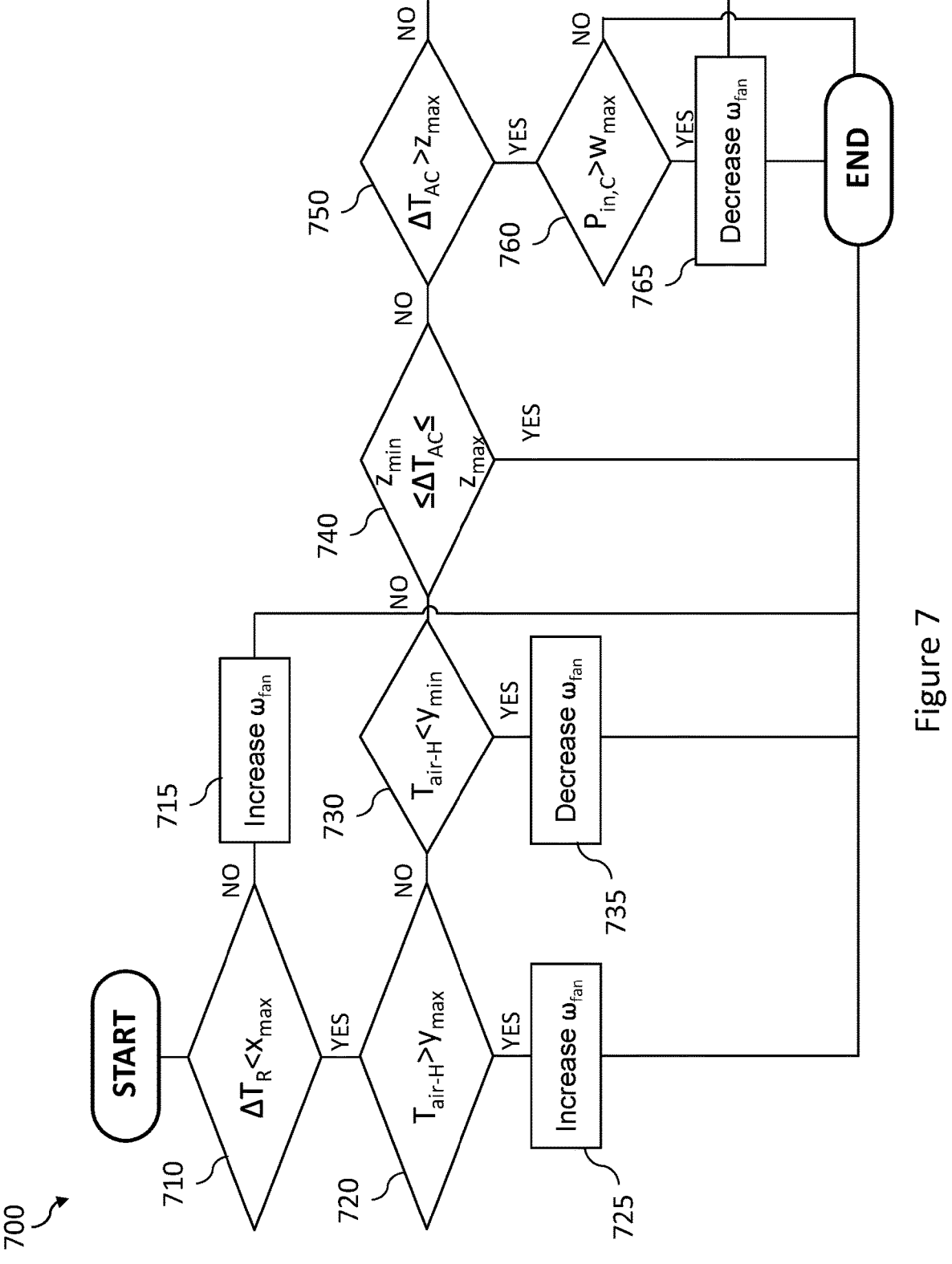
FIG. 7 is a decision tree showing operations of the cooling system of FIG. 1 in accordance with an embodiment of the present technology.

With reference to FIG. 7, a decision tree illustrates a method 700 for managing cooling by the cooling system 100 in accordance with at least one non-limiting embodiment of the present technology.

At operation 710, the method 700 begins with the controller 930 determining a temperature difference between temperature indications provided by the first temperature sensor 601 and the second temperature sensor 602, namely $\Delta T_R = |T_{Ri} - T_{Ro}|$. In response to the temperature difference $\Delta T_R$ being above a first liquid temperature threshold $x_{max}$, the controller 930 increases the rotational speed $\omega_{fan}$ of the fans 102 at operation 715.

Otherwise, in response to the temperature difference $\Delta T_R$ being below the first liquid temperature threshold $x_{max}$, the method 700 continues with the controller 930 determining, based on temperature indications provided by the sixth temperature sensor 606, whether the temperature $T_{air-H}$ is above a second air temperature threshold $y_{max}$ at operation 720. In response to the temperature $T_{air-H}$ being above the second air threshold $y_{max}$, the controller 930 increases the rotational speed $\omega_{fan}$ of the fans 102 at operation 725.

Otherwise, in response to the temperature $T_{air-H}$ being below the second air threshold $y_{max}$, the method 700 continues with the controller 930 determining, based on the temperature indications provided by the sixth temperature sensor 606, whether the temperature $T_{air-H}$ is below a third air temperature threshold $y_{min}$ at operation 730. In response to the temperature $T_{air\text{-}H}$ being below the third air temperature threshold $y_{min}$, the controller 930 decreases the rotational speed $\omega_{fan}$ of the fans 102 at operation 735.

In response to the temperature $T_{air\text{-}H}$ being above the third air temperature threshold $y_{min}$, the method 700 continues with the controller 930 determining, based on the temperature indications provided by the first temperature sensor 601 and the third temperature sensor 603, a second temperature difference $\Delta T_{AC}$–$|T_{AC\text{-}0}$–$T_{Ri}|$. At operation 740, the controller 930 determines whether the temperature difference $\Delta T_{AC}$ is between a fourth liquid temperature threshold $z_{min}$ and a fifth liquid temperature threshold $z_{max}$ (with $z_{max}$>$z_{min}$). If not, the method 700 continues with the controller 930 determining whether the temperature difference $\Delta T_{AC}$ is above the fifth liquid temperature threshold $z_{max}$ at operation 750. In response to the second temperature difference $\Delta T_{AC}$ being below the fifth liquid temperature threshold $z_{max}$, the controller 930 decreases the rotational speed $\omega_{fan}$ of the fans 102 at operation 765.

Otherwise, in response to the second temperature difference $\Delta T_{AC}$ being above the fifth temperature liquid threshold $z_{max}$, the method 700 continues with the controller 930 determining, based on the temperature indications provided by the first temperature sensor 601 and the fifth temperature sensor 605, a third temperature difference $P_{inc}$–$|T_{air\text{-}C}$–$T_{Ri}|$, also called the "pinch temperature". The method 700 then continues with the controller 930 determining whether the pinch temperature is above a sixth air-liquid temperature threshold $w_{max}$ at operation 760. In response to the pinch temperature being above the sixth air-liquid temperature threshold $w_{max}$, the method 700 further continues with the controller 930 decreasing the rotational speed $\omega_{fan}$ of the fans 102 at operation 765.

Figure 8:
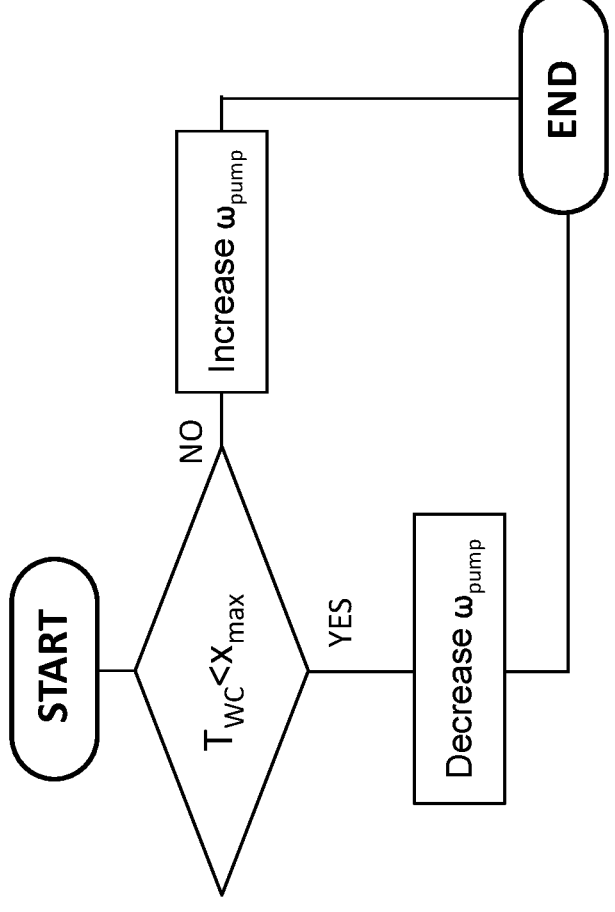
FIG. 8 is a decision tree showing operations of the cooling system of FIG. 1 in accordance with another embodiment of the present technology.

In FIG. 8, another decision tree illustrates another method 800 for managing the cooling system 100 in accordance with an embodiment of the present technology.

At operation 810, the controller 930 receives a temperature indication from the fourth temperature sensor 604 indicative of the temperature $T_{WC}$. In response to the temperature $T_{WC}$ being below the first threshold $x_{max}$, the controller 930 decreases a rotational speed $\omega_{pump}$ of the pump 516 at operation 815. Otherwise, in response to the temperature $T_{WC}$ being above the first threshold $x_{max}$, the controller 930 increases the rotational speed $\omega_{pump}$ of the pump 516 at operation 820.

Operations of the decision tree 800 may be executed in parallel to operations of the decision tree 700. The methods 700 and 800 permit to control the cooling system 100 to provide cooling to the rack 10 such that the ambient air expelled by the fans 12 may be further used as the air flow of ambient air pulled within the rack 10. More specifically, the ambient air in a vicinity of the rack may not be cooled before entering the rack 10. The methods 700 and 800 thus provides, without being limited thereto, management of the air temperature in a vicinity of the rack 10 based on a control of the cooling system 100. There may thus be no need to cool a surrounding environment of the rack 10 to suitably provide cooling to the rack 10.

In this embodiment, adjusting the rotational speeds $\omega_{fan}$ and $\omega_{pump}$ of the fans 102 and the pump 516 respectively is performed by increasing and/or decreased said rotational speed by a pre-determined value. For example, upon determining that the rotational speed $\omega_{fan}$ of the fans 102 is to be increased at operation 715, the controller 930 may be configured to increase the rotational speed $\omega_{fan}$ by 5 radians per second, or any other pre-determined value. As another example, the controller 930 may adjust the rotational speeds $\omega_{fan}$ and $\omega_{pump}$ by a pre-determined percentage of a current value of the rotational speeds $\omega_{fan}$ and $\omega_{pump}$. In this example, upon determining that the rotational speed $\omega_{fan}$ of the fans 102 is to be increased at operation 715, the controller 930 may be configured to increase the rotational speed $\omega_{fan}$ by 1% of a current value of the rotational speed $\omega_{fan}$.

In this embodiment, adjusting the rotational speeds $\omega_{fan}$ and $\omega_{pump}$ based on the temperature indications is performed incrementally according to the decision trees 700 and 800, an incrementation corresponding to an execution of one of the decisions trees 700 and 800. In the same or another embodiment, adjusting the rotational speeds $\omega_{fan}$ and $\omega_{pump}$ based on the temperature indications is performed at a predetermined time interval. The predetermined time interval may be a repeating time interval (e.g. one minute) or a one-time delay. As such, in one embodiment, at operation 725 for example, the controller may be configured to wait one minute after having increased the rotational speed $\omega_{fan}$ of the fans 102 before starting a new iteration of the decision tree 700 (i.e. executing operation 710).

A memory device 935 (see FIG. 9) of the controller 930 may comprise information about lower and upper limits of the rotational speed $\omega_{fan}$ and lower and upper limits of the rotational speed $\omega_{pump}$. In this embodiment, the lower and upper limits of the rotational speeds $\omega_{fan}$ and $\omega_{pump}$ may be set such that a given minimal amount of thermal energy is carried away from the heat-generating components 50.

Figure 9:
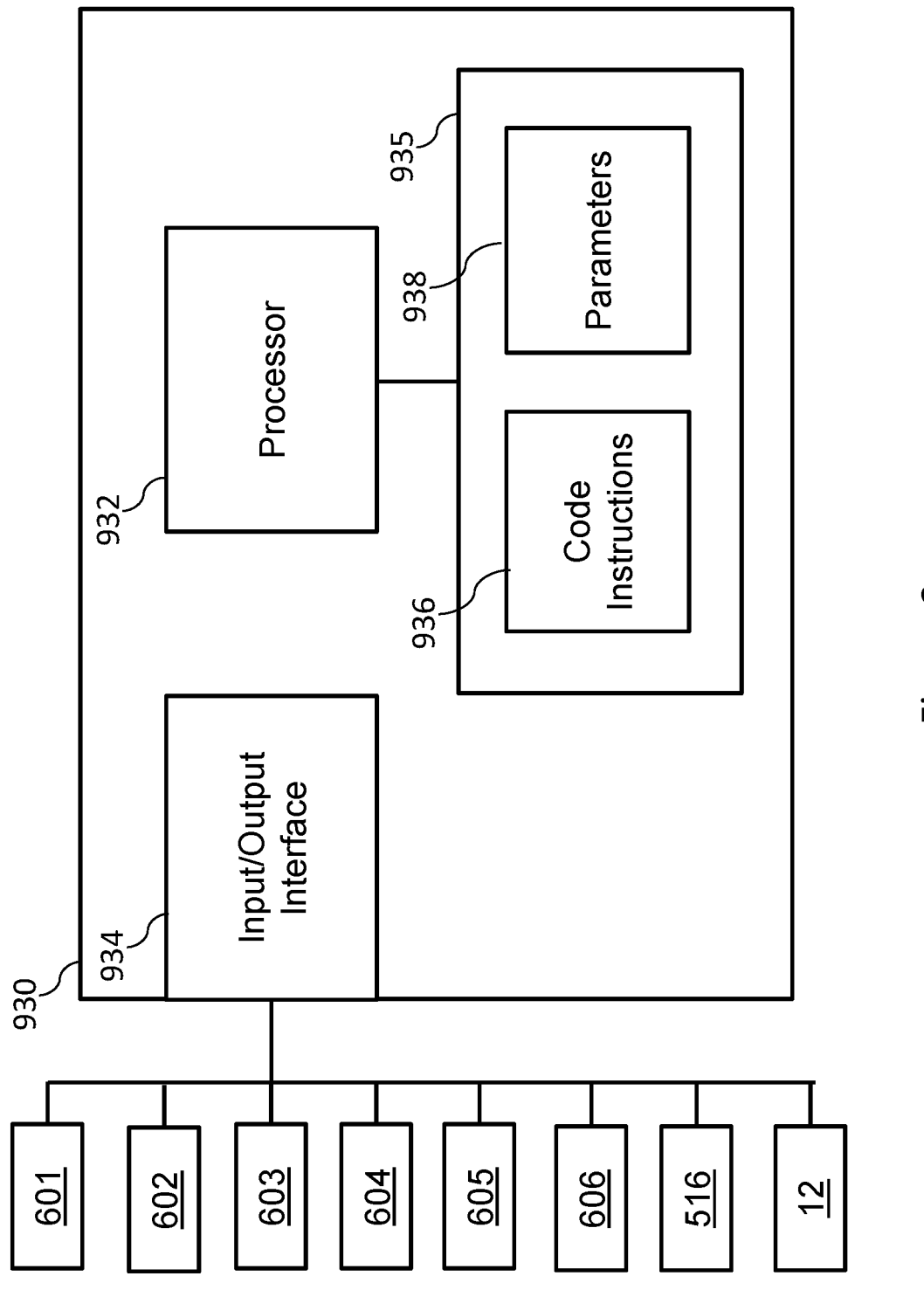
FIG. 9 is a block diagram of a controller for controlling the cooling system of FIG. 1 in accordance with an embodiment of the present technology.

As an example, FIG. 9 is a schematic block diagram of the controller 930 of the data receiver 100 according to an embodiment of the present technology. The controller 930 comprises a processor or a plurality of cooperating processors (represented as a processor 910 for simplicity), a memory device or a plurality of memory devices (represented as a memory device 935 for simplicity), and an input/output interface 920 allowing the controller 930 to communicate with the plurality of sensors 601, 602, 603, 604, 605 and 606, the pump 516, the one or more fans 12 and other components of the cooling system 100. The processor 910 is operatively connected to the memory device 935 and to the input/output interface 920. The memory device 935 includes a storage for storing parameters 934, including for example and without limitation temperature indications provided by the sensors 601 to 606. The memory device 935 may comprise a non-transitory computer-readable medium for storing code instructions 932 that are executable by the processor 910 to allow the controller 930 to perform the various tasks allocated to the controller 930 in the decision trees 700 and 800.

The controller 930 is operatively connected, via the input/output interface 920, to the sensors 601, 602, 603, 604, 605 and 606, the pump 516 and the one or more fans 12. The controller 930 executes the code instructions 932 stored in the memory device 935 to implement the various above-described functions that may be present in a particular embodiment. FIG. 9 as illustrated represents a non-limiting embodiment in which the controller 930 orchestrates operations of the one or more fans 12 and the pump 516. This particular embodiment is not meant to limit the present disclosure and is provided for illustration purposes.

While the above-described implementations have been described and shown with reference to particular steps performed in a particular order, it will be understood that these steps may be combined, sub-divided, or re-ordered without departing from the teachings of the present technology. At least some of the steps may be executed in parallel or in series. Accordingly, the order and grouping of the steps is not a limitation of the present technology.

It should be expressly understood that not all technical effects mentioned herein need to be enjoyed in each and every embodiment of the present technology.

Modifications and improvements to the above-described implementations of the present technology may become apparent to those skilled in the art. The foregoing description is intended to be exemplary rather than limiting. The scope of the present technology is therefore intended to be limited solely by the scope of the appended claims.

What is claimed is:

1. A method for controlling a cooling system of a rack, the rack comprising at least one heat generating component, the method being executable by a controller, the method comprising:

determining, by the controller, a temperature difference between a temperature of heat transfer fluid received by the cooling system from a cold supply line and a temperature of heat transfer fluid returning from the cooling system to a hot return line;

increasing, by the controller, a rotational speed of at least one fan of the cooling system in response to the temperature difference being above a threshold;

receiving, by the controller, at least one first temperature indication indicative of temperature variations of heat transfer fluid circulating in at least one respective liquid channel of the cooling system;

receiving, by the controller, at least one second temperature indication indicative of a temperature of an air flow of ambient air within the rack, the air flow being generated by the at least one fan;

adjusting, based on the at least one first temperature indication and the at least one second temperature indication, the rotational speed of the at least one fan and a rotational speed of at least one pump configured for causing the heat transfer fluid to flow in the at least one respective liquid channel;

receiving, by the controller, an expelled air temperature indication indicative of a temperature of ambient air being expelled from the rack;

receiving, by the controller, an incoming fluid temperature indication indicative of a temperature of the heat transfer fluid entering the at least one respective liquid channel; and decreasing, based on the expelled air temperature indication and the incoming fluid temperature indication, the rotational speed of the at least one fan.

2. The method of claim 1, further comprising:

sensing a temperature of a heat transfer fluid entering in at least one liquid cooling unit, the at least one liquid cooling unit being thermally coupled to the at least one heat generating component;

decreasing, in response to the temperature of the heat transfer fluid entering the at least one liquid cooling unit being below a second threshold, the rotational speed of the at least one pump; and increasing the rotational speed of the at least one pump otherwise.

3. The method of claim 1, wherein the cooling system comprises:

a closed loop comprising:

at least one liquid cooling unit thermally coupled to the at least one heat generating component, the at least one liquid cooling unit comprising a liquid channel configured for transferring thermal energy from the at least one heat generating component to heat transfer fluid flowing in the liquid channel, a first primary side of a first liquid-to-liquid heat exchanger, the first primary side being fluidly connected to the liquid channel of the at least one liquid cooling unit, and at least one pump fluidly connected between the first primary side of the first liquid-to-liquid heat exchanger and the at least one liquid cooling unit, the at least one pump being configured for causing the heat transfer fluid to flow within the closed loop; and an open loop comprising:

an air-to-liquid heat exchanger mounted to the rack so that heated air expelled from the rack by the at least one fan flows through the air-to-liquid heat exchanger before being rejected as ambient air, the air-to-liquid heat exchanger being configured for receiving heat transfer fluid from the cold supply line, and a first secondary side of the first liquid-to-liquid heat exchanger, the first secondary side being thermally coupled to the first primary side for transfer of thermal energy from the first primary side to the first secondary side when a temperature of the first primary side is higher than a temperature of the first secondary side, the first secondary side being fluidly connected to the air-to-liquid heat exchanger, the first secondary side being configured for returning transfer fluid to the hot return line.

4. The method of claim 3, wherein:

adjusting the rotational speed of the at least one fan comprises increasing the rotational speed of the at least one fan in response to the temperature of the air flow of ambient air within the rack being above a second threshold.

5. The method of claim 1, wherein adjusting the rotational speed of the at least one fan and the rotational speed of the at least one pump is performed incrementally.

6. The method of claim 1, wherein adjusting the rotational speed of the at least one fan and the rotational speed of the at least one pump is performed at a predetermined time interval.

7. A cooling system for autonomous cooling of a rack, the rack comprising at least one heat generating component, the cooling system comprising:

at least one fan mounted onto the rack and configured for generating an air flow of ambient air within the rack, the air flow receiving at least a portion of a thermal energy generated by the at least one heat generating component in the rack;

a closed loop comprising:

at least one liquid cooling unit thermally coupled to the at least one heat generating component, the at least one liquid cooling unit comprising a liquid channel configured for transferring thermal energy from the at least one heat generating component to a first heat transfer fluid flowing in the liquid channel, a first primary side of a first liquid-to-liquid heat exchanger, the first primary side being fluidly connected to the liquid channel of the at least one liquid cooling unit, and at least one pump fluidly connected between the first primary side of the first liquid-to-liquid heat exchanger and the at least one liquid cooling unit, the at least one pump being configured causing the first heat transfer fluid to flow within the closed loop;

an open loop comprising:

an air-to-liquid heat exchanger mounted to the rack so that heated air expelled from the rack by the at least one fan flows through the air-to-liquid heat exchanger before being rejected as ambient air, the air-to-liquid heat exchanger being configured to receive a second heat transfer fluid from a first cold supply line, and a first secondary side of the first liquid-to-liquid heat exchanger, the first secondary side being thermally coupled to the first primary side for transfer of thermal energy from the first primary side to the first secondary side when a temperature of the first primary side is higher than a temperature of the first secondary side, the first secondary side being fluidly connected to the air-to-liquid heat exchanger, the first secondary side being configured for returning the second heat transfer fluid to a hot return line; and a controller operatively connected to the at least one fan and the at least one pump, the controller being communicatively connected to a first temperature sensor configured to measure a temperature of the second heat transfer fluid received from the first cold supply line and a second temperature sensor configured to measure a temperature of the second heat transfer fluid returning to the hot return line.

8. The cooling system of claim 7, wherein the controller receives temperature indications indicative of thermodynamic parameters of at least one of the first heat transfer fluid, the second heat transfer fluid, the ambient air and the air flow within the rack.

9. The cooling system of claim 7, wherein the controller is communicatively connected to:

a third temperature sensor of the second heat transfer fluid entering the first secondary side of the first liquid-to-liquid heat exchanger;

a fourth temperature sensor of the first heat transfer fluid entering the at least one liquid cooling unit;

a fifth temperature sensor of the ambient air in a vicinity of the rack; and a sixth temperature sensor of the air flow within the rack.

10. The cooling system of claim 9, wherein the controller comprises:

a processor; and a memory configured to store instructions, upon being executed by the processor, the instructions causing the controller to adjust, based on temperature indications from the first temperature sensor, second temperature sensor, third temperature sensor, fourth temperature sensor, fifth temperature sensor, or sixth temperature sensor, at least one of:

a rotational speed of the at least one fan, and a rotational speed of the at least one pump.

11. The cooling system of claim 10, wherein execution of the instructions by the processor causes the controller to, in response to a difference between a first temperature sensed by the first temperature sensor and a second temperature sensed by the second temperature sensor being above a first threshold, increase the rotational speed of the at least one fan.

12. The cooling system of claim 11, wherein execution of the instructions by the processor further causes the controller to, in response to the difference being below the first threshold and a third temperature of air flow within the rack being above a second threshold, increase the rotational speed of the at least one fan.

13. A system for controlling a cooling system of a rack, the rack comprising at least one heat generating component, the system comprising at least one processor and memory comprising executable instructions which, when executed by the at least one processor, cause the system to:

determine a temperature difference between a temperature of heat transfer fluid received by the cooling system from a cold supply line and a temperature of heat transfer fluid returning from the cooling system to a hot return line;

increase a rotational speed of at least one fan of the cooling system in response to the temperature difference being above a threshold;

receive at least one first temperature indication indicative of temperature variations of heat transfer fluid circulating in at least one respective liquid channel of the cooling system;

receive at least one second temperature indication indicative of a temperature of an air flow of ambient air within the rack, the air flow being generated by the at least one fan;

adjust based on the at least one first temperature indication and the at least one second temperature indication, the rotational speed of the at least one fan and a rotational speed of at least one pump configured for causing the heat transfer fluid to flow in the at least one respective liquid channel;

receive an expelled air temperature indication indicative of a temperature of ambient air being expelled from the rack;

receive an incoming fluid temperature indication indicative of a temperature of the heat transfer fluid entering the at least one respective liquid channel; and decrease, based on the expelled air temperature indication and the incoming fluid temperature indication, the rotational speed of the at least one fan.

* * * * *